(12) United States Patent
Yoshida (10) Patent No.: US 6,285,424 B1
(45) Date of Patent: Sep. 4, 2001

(54) BLACK MASK, COLOR FILTER AND LIQUID CRYSTAL DISPLAY

(75) Inventor: Kazuaki Yoshida, Tsukuba (JP)

(73) Assignee: Sumitomo Chemical Company, Limited, Osaka (JP)

(*) Notice: Subject to any disclaimer, the term of this patent is extended or adjusted under 35 U.S.C. 154(b) by 0 days.

(21) Appl. No.: 09/184,955

(22) Filed: Nov. 3, 1998

(30) Foreign Application Priority Data

Nov. 7, 1997 (JP) .................................................. 9-305593
Nov. 7, 1997 (JP) .................................................. 9-305594

(51) Int. Cl.[7] ........................ G02F 1/1335; G02F 1/1333; B02B 15/00; G03F 9/00
(52) U.S. Cl. .......................... 349/110; 349/111; 349/137; 349/106; 430/7; 428/432
(58) Field of Search ..................................... 349/110, 111, 349/106, 137; 430/5, 7; 428/432; 204/192.28

(56) References Cited

U.S. PATENT DOCUMENTS

| | | | |
|---|---|---|---|
| 4,720,442 | * 1/1988 | Shinkai et al. | 430/5 |
| 5,419,969 | * 5/1995 | Miyazaki et al. | 428/426 |
| 5,570,212 | * 10/1996 | Steigerwald | 349/110 |
| 6,128,057 | * 10/2000 | Suzuki et al. | 349/110 |

* cited by examiner

*Primary Examiner*—Toan Ton
(74) *Attorney, Agent, or Firm*—Birch, Stewart, Kolasch & Birch, LLP (57) ABSTRACT

A black mask comprises: a first and a second antireflection films each comprising oxide, nitride, carbide, oxide nitride, oxide carbide, nitride carbide, or oxide nitride carbide of at least one kind of metal selected from the group consisting of chromium, molybdenum, tungsten, nickel, and germanium, and said films each having a different composition; and a screening film comprising at least one kind of metal selected from the group consisting of chromium, molybdenum, tungsten, nickel, and germanium; wherein said three films are successively formed on a transparent substrate, and at least one but not all of said three films contains chromium.

Having improved etching characteristics at the manufacturing process, low reflectivity in the whole visible wavelength range, and a small wavelength dependence of reflectivity, the black mask can be preferably used for a color filter and a liquid crystal display which can show clear pictures.

7 Claims, 3 Drawing Sheets

BLACK MASK, COLOR FILTER AND LIQUID CRYSTAL DISPLAY

BACKGROUND OF THE INVENTION

1. Field of the Invention

The present invention relates to a black mask, a color filter and a liquid crystal display.

2. Description of the Related Art

A STN or TFT color liquid crystal display includes a color filter at a position opposite to a liquid crystal layer. The color filter has colored resins separated by a black mask having a plurality of apertures, and the visibility of the liquid crystal display depends upon the characteristics of the black mask. Conventional black masks are described in JP-A-8-179301, 8-36171, and 9-243801.

In a color filter for use in a liquid crystal display, it is required to reduce the optical reflectivity on the surface of a black mask, and the wavelength dependence of the reflectivity in the visible wavelength range in order to improve the visibility of a panel, that is, to make the change of the reflectivity in the wavelength range (wavelength dependence of reflectivity) small.

The black mask described in JP-A-8-179301 is so constructed that all of the layers contain the same kind of metal. That is, the black mask described in the above publication comprises a first antireflection film consisting of a chromium compound, a second antireflection film consisting of a chromium compound, and a screening film consisting of chromium, the films being successively formed. More particularly, the first antireflection film consisting of a chromium compound contains Cr, O, N, and C, the second antireflection film consisting of a chromium compound contains Cr, N, O, and C, and the screening film consisting of chromium contains only chromium metal. However, the wavelength dependence of the reflectivity on the surface of this black mask remains large, and the reflectivity is not reduced sufficiently.

The first antireflection film consisting of a chromium compound in the black mask described in the above JP-A-8-36171 contains chromium and oxygen as main components, the second antireflection film consisting of a chromium compound contains chromium and nitrogen as main components, and the screening film consisting of chromium contains chromium metal as a main component. However, there is a substantial difference in etching rates among these films. The etching rates depend upon the conditions of the film-forming process. Assuming the etching rate of the screening film mainly composed of chromium metal being subjected to wet etching by the use of an etchant such as ammonium cerium (IV) nitrate to be 1, the etching rate of the first antireflection film mainly composed of chromium and oxygen is generally 0.5 or less, while the etching rate of the second antireflection film mainly composed of chromium and nitrogen is generally 5 or more. Therefore, when the black mask of the above-described three-layer structure is subjected to wet etching, a precise pattern can be hardly formed due to the difference in etching rates among these films.

The black mask described in JP-A-9-243801 does not contain a chromium component. However, a precise pattern cannot be formed due to the difference in etching rate among the three layers.

An object of the present invention is to provide a black mask having improved etching characteristics at the manufacturing process, having low reflectivity in the whole visible wavelength range, and having a small wavelength dependence of reflectivity, which can be preferably used for a color filter and a liquid crystal display which can show clear pictures.

SUMMARY OF THE INVENTION

The black mask of the present invention comprises: a first and a second antireflection films each comprising oxide, nitride, carbide, oxide nitride, oxide carbide, nitride carbide, or oxide nitride carbide of at least one kind of metal selected from the group consisting of chromium, molybdenum, tungsten, nickel, and germanium, and said films each having a different composition; and a screening film comprising at least one kind of metal selected from the group consisting of chromium, molybdenum, tungsten, nickel, and germanium; wherein said three films are successively formed on a transparent substrate, and at least one but not all of said three films contains chromium.

The denotations used in the figures are as follows.
1: Color filter
2: Transparent substrate
3: First antireflection film
4: Second antireflection film
5: Screening film
6: Overcoat layer
7: Transparent electrode
8: Polarizing film
20: TFT substrate
21: Outer frame
22: Liquid crystal layer
23: Pixel electrode
24: Transparent glass substrate
25: Polarizing film
26: Backlight
100: Liquid crystal display
BM: Black mask

DETAILED DESCRIPTION OF THE INVENTION

In the black mask of the present invention, it is preferable that both of the first and second antireflection film comprises tungsten compounds, and the screening film comprises chromium.

It is also preferable that the first antireflection film comprises a chromium compound, the second antireflection film comprises a molybdenum compound or a tungsten compound, and the screening film comprises chromium.

The black mask of the present invention has improved etching characteristics at the manufacturing process, and has reflective characteristics largely exceeding the reflective characteristics of the aforementioned conventional black masks, and hence it can reduce the reflectivity in the whole visible wavelength range and the wavelength dependence thereof.

The color filter of the present invention comprises such a black mask, and colored resins disposed within a plurality of apertures of the black mask. The black mask separates the colored resins each disposed within its respective aperture, and hence the color filter separates the light transmitted through the colored resins. The reflectivity of the light applied to the black mask through a transparent substrate, and the wavelength dependence of the reflectivity are small. Therefore, the ratio of the reflected light to the light transmitted through the colored resins can be reduced, resulting in an improvement in visibility of the light transmitted through the colored resins.

The liquid crystal display of the present invention comprises: a first substrate comprising this color filter; a second substrate comprising a plurality of electrodes; a liquid crystal layer being interposed between the first and second substrates, and capable of independently changing its orientation at different regions opposite to a plurality of the apertures of the black mask by applying a potential to the electrodes. In this liquid crystal display, an electrode can be applied with a prescribed potential to independently change the orientation at different regions, of the liquid crystal layer, opposite to a plurality of apertures of the black mask. Accordingly, the amount of light inputted to the liquid crystal layer can be independently controlled at different apertures of the black mask. Colored resins are disposed in their respective apertures of the black mask, and hence the light of a wavelength corresponding to each colored resin can be independently emitted from its respective region mentioned above. The color filter of the liquid crystal display can improve the visibility of the light transmitted through the colored resin, and hence clear pictures can be displayed on this liquid crystal display.

The embodiment of the present invention will now be described using a color filter having a black mask.

Figure 1:
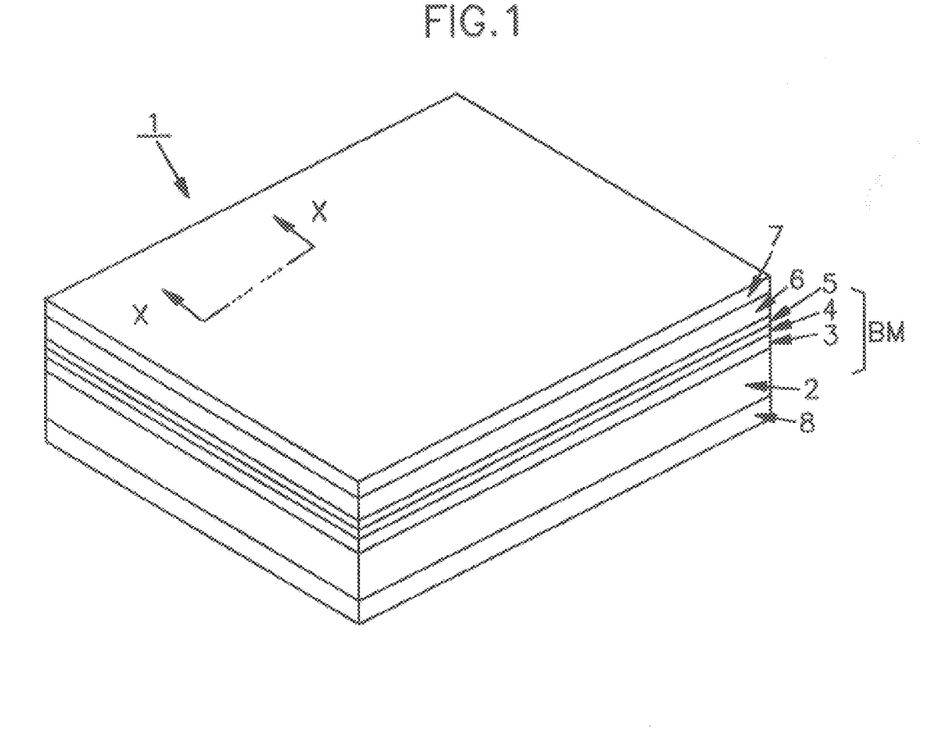
FIG. 1 is a perspective view of a color filter.

FIG. 1 shows a perspective view illustrating a color filter 1. The color filter 1 includes a transparent glass substrate 2, a black mask BM (black matrix) made of a first antireflection film 3, a second antireflection film 4, and a screening film 5 successively formed on a transparent glass substrate 2, an overcoat layer 6 formed on the black mask BM, and a transparent electrode 7 formed on the overcoat layer 6. Further, a polarizing film 8 is attached on the back side of the transparent glass substrate 2.

The black mask BM of the present invention includes the first and second antireflection films 3 and 4, successively formed on the transparent substrate 2, and made of different kinds of metallic compounds having mutually different compositions, and the screening film 5 formed on the second antireflection film 4. At least any one of the aforementioned films 3, 4, and 5 contains chromium (Cr).

The first antireflection film 3 contains oxide nitride, oxide carbide, or oxide nitride carbide of at least one kind of metal selected from the group consisting of chromium (Cr), molybdenum (Mo), tungsten (W), nickel (Ni), and germanium (Ge).

The second antireflection film 4 contains a different metal compound from those in the first antireflection film 3, and preferably contains oxide, nitride, carbide, oxide nitride, oxide carbide, nitride carbide, or oxide nitride carbide of at least one kind of metal selected from the group consisting of Cr, Mo, W, Ni, and Ge.

As metal compounds, mixtures and/or mixed crystals thereof can also be used.

The film thickness of the first antireflection film 3 and the second antireflection film 4 is preferably in the range of 5 to 200 nm in order to reduce the reflectivity. It is more preferably in the range of 20 to 60 nm in terms of reducing the reflectivity and the wavelength dependence.

The materials used for the screening film 5, are metals which screen the visible light, and differ from the metals used for the metal compounds of first antireflection film 3 or the second antireflection film 4. Examples of the metals include Cr, Mo, W, Ni, and Ge. The film thickness of the screening film 5 is not specifically limited as long as the film 5 screens visible light. However, it is preferably in the range of 20 to 500 nm, and more preferably in the range of 50 to 150 nm in terms of screening performances and throughput of manufacturing.

The first and second antireflection films 3 and 4 are made of different kinds of metallic compounds having mutually different compositions. Accordingly, while the refractive index and extinction coefficient can be set so as to ensure antireflection, to reduce the wavelength dependence of the reflectivity, and to equalize the etching rates of these films. When the screening film, and the first and second antireflection films contain Cr, the etching rate of each film can be hardly equalized. In the present invention, at least one of the first antireflection film 3 and second antireflection film 4 contains a different metal from chromium, and the etching rates of the two films can be equalized.

Tables 1 to 6 show the materials which can be used for each film. The subscripts X, Y, Z, A, B, and C denote the ratio of numbers of atoms of each corresponding nonmetal element to the metallic element (Cr, Mo, W, Ni, or Ge).

TABLE 1

| First antireflection film | Second antireflection film | Screening film |
|---|---|---|
| $CrO_XC_Z$, $CrO_XN_Y$, $CrO_XN_YC_Z$, $CrO_X$, $CrN_Y$, or $CrN_YC_Z$ | $MoO_A$, $MoC_C$, $MoN_B$, $MoO_AC_C$, $MoO_AN_B$, $MoN_BC_C$, $MoO_AN_BC_C$ $WO_A$, $WC_C$, $WN_B$, $WO_AC_C$, $WO_AN_B$, $WN_BC_C$, $WO_AN_BC_C$ $NiO_A$, $NiC_C$, $NiN_B$, $NiO_AC_C$, $NiO_AN_B$, $NiN_BC_C$, $NiO_AN_BC_C$ $GeO_A$, $GeC_C$, $GeN_B$, $GeO_AC_C$, $GeO_AN_B$, $GeN_BC_C$, or $GeO_AN_BC_C$ | Cr, Mo, W, Ni, or Ge |

TABLE 2

| First antireflection film | Second antireflection film | Screening film |
|---|---|---|
| $MoO_XC_Z$, $MoO_XN_Y$, $MoO_XN_YC_Z$, $MoO_X$, $MoN_Y$, or $MoN_YC_Z$ | $CrO_A$, $CrC_C$, $CrN_B$, $CrO_AC_C$, $CrO_AN_B$, $CrN_BC_C$, $CrO_AN_BC_C$, $WO_A$, $WC_C$, $WN_B$, $WO_AC_C$, $WO_AN_B$, $WN_BC_C$, $WO_AN_BC_C$, $NiO_A$, $NiC_C$, $NiN_B$, $NiO_AC_C$, $NiO_AN_B$, $NiN_BC_C$, $NiO_AN_BC_C$, $GeO_A$, $GeC_C$, $GeN_B$, $GeO_AC_C$, $GeO_AN_B$, $GeN_BC_C$, or $GeO_AN_BC_C$ | Cr, Mo, W, Ni, or Ge |

TABLE 3

| First antireflection film | Second antireflection film | Screening film |
|---|---|---|
| $WO_XC_Z$, $WO_XN_Y$, $WO_XN_YC_Z$, $WO_X$, $WN_Y$, or $WN_YC_Z$ | $CrO_A$, $CrC_C$, $CrN_B$, $CrO_AC_C$, $CrO_AN_B$, $CrN_BC_C$, $CrO_AN_BC_C$, $MoO_A$, $MoC_C$, $MoN_B$, $MoO_AC_C$, $MoO_AN_B$, $MoN_BC_C$, $MoO_AN_BC_C$, $NiO_A$, $NiC_C$, $NiN_B$, $NiO_AC_C$, $NiO_AN_B$, $NiN_BC_C$, $NiO_AN_BC_C$, $GeO_A$, $GeC_C$, $GeN_B$, $GeO_AC_C$, $GeO_AN_B$, $GeN_BC_C$, or $GeO_AN_BC_C$ | Cr, Mo, W, Ni, or Ge |

TABLE 4

| First antireflection film | Second antireflection film | Screening film |
|---|---|---|
| $NiO_XC_Z$, $NiO_XN_Y$, $NiO_XN_YC_Z$, $NiO_X$, $NiN_Y$, or $NiN_YC_Z$ | $CrO_A$, $CrC_C$, $CrN_B$, $CrO_AC_C$, $CrO_AN_B$, $CrN_BC_C$, $CrO_AN_BC_C$, $MoO_A$, $MoC_C$, $MoN_B$, $MoO_AC_C$, $MoO_AN_B$, $MoN_BC_C$, $MoO_AN_BC_C$, $NiO_A$, $NiC_C$, $NiN_B$, $NiO_AC_C$, $NiO_AN_B$, $NiN_BC_C$, $NiO_AN_BC_C$, $GeO_A$, $GeC_C$, $GeN_B$, $GeO_AC_C$, $GeO_AN_B$, $GeN_BC_C$, or $GeO_AN_BC_C$ | Cr, Mo, W, Ni, or Ge |

TABLE 5

| First antireflection film | Second antireflection film | Screening film |
|---|---|---|
| $GeO_XC_Z$, $GeO_XN_Y$, $GeO_XN_YC_Z$, $GeO_X$, $GeN_Y$, $GeC_Z$, or $GeN_YC_Z$ | $CrO_A$, $CrC_C$, $CrN_B$, $CrO_AC_C$, $CrO_AN_B$, $CrN_BC_C$, $CrO_AN_BC_C$, $MoO_A$, $MoC_C$, $MoN_B$, $MoO_AC_C$, $MoO_AN_B$, $MoN_BC_C$, $MoO_AN_BC_C$, $WO_A$, $WC_C$, $WN_B$, $WO_AC_C$, $WO_AN_B$, $WN_BC_C$, $WO_AN_BC_C$, $NiO_A$, $NiC_C$, $NiN_B$, $NiO_AC_C$, $NiO_AN_B$, $NiN_BC_C$, or $NiO_AN_BC_C$ | Cr, Mo, W, Ni, or Ge |

TABLE 6

| First antireflection film | Second antireflection film | Screening film |
|---|---|---|
| $CrO_X$, $CrC_Z$, $CrN_Y$, $CrO_XC_Z$, $CrO_XN_Y$, $CrN_YC_Z$, or | $CrO_A$, $CrC_C$, $CrN_B$, $CrO_AC_C$, $CrO_AN_B$, $CrN_BC_C$, or | Mo, W, Ni, or Ge |

TABLE 6-continued

| First antireflection film | Second antireflection film | Screening film |
|---|---|---|
| $CrO_XN_YC_Z$ | $CrO_AN_BC_C$ | |
| $MoO_X$, | $MoO_A$, | Cr |
| $MoC_Z$, | $MoC_C$, | |
| $MoN_Y$, | $MoN_B$, | |
| $MoO_XC_Z$, | $MoO_AC_C$, | |
| $MoO_XN_Y$, | $MoO_AN_B$, | |
| $MoN_YC_Z$, or | $MoN_BC_C$, or | |
| $MoO_XN_YC_Z$ | $MoO_AN_BC_C$ | |
| $WO_X$, | $WO_A$, | |
| $WC_Z$, | $WC_C$, | |
| $WN_Y$, | $WN_B$, | |
| $WO_XC_Z$, | $WO_AC_C$, | |
| $WO_XN_Y$, | $WO_AN_B$, | |
| $WN_YC_Z$, or | $WN_BC_C$, or | |
| $WO_XN_YC_Z$ | $WO_AN_BC_C$ | |
| $NiO_X$, | $NiO_A$, | |
| $NiC_Z$, | $NiC_C$, | |
| $NiN_Y$, | $NiN_B$, | |
| $NiO_XC_Z$, | $NiO_AC_C$, | |
| $NiO_XN_Y$, | $NiO_AN_B$, | |
| $NiN_YC_Z$, or | $NiN_BC_C$, or | |
| $NiO_XN_YC_Z$ | $NiO_AN_BC_C$ | |
| $GeO_X$, | $GeO_A$, | |
| $GeC_Z$, | $GeC_C$, | |
| $GeN_Y$, | $GeN_B$, | |
| $GeO_XC_Z$, | $GeO_AC_C$, | |
| $GeO_XN_Y$, | $GeO_AN_B$, | |
| $GeN_YC_Z$, or | $GeN_BC_C$, or | |
| $GeO_XN_YC_Z$ | $GeO_AN_BC_C$ | |

It is preferable that the first antireflection film 3 is made of a tungsten compound, the second antireflection film 4 is made of another tungsten compound, and the screening film 5 is made of chromium. More preferably, when the materials constituting the first antireflection film 3/second antireflection film 4/screening film 5 are (1) $WO_XN_YC_Z/WO_AN_BC_C/Cr$, the etching rates thereof can be made close to one another to obtain a precise pattern.

It is also preferable that the first antireflection film 3 is made of a chromium compound, the second antireflection film 4 is made of a molybdenum compound or a tungsten compound, and the screening film 5 is made of chromium. More preferably, when the materials constituting the first antireflection film 3/second antireflection film 4/screening film 5 are (2) $CrO_XN_YC_Z/WO_AN_BC_C/Cr$, the etching rates thereof can be made close to one another to obtain a precise pattern.

Also, when the materials constituting the first antireflection film 3/second antireflection film 4/screening film 5 are (3) $CrO_XN_Y/MoO_AN_B/Cr$, or (4) $CrO_XN_Y/WO_AN_B/Cr$, the etching rates thereof can be made close to one another to obtain a precise pattern.

As for the above mentioned black masks, in case of assuming the etching rate of Cr to be 1, all of the etching rates of the materials constituting the first and second antireflection films 3 and 4, and the screening film 5 are 1 or less. Also, the ratio of numbers of atoms of each film can be set the refractive index and extinction coefficient so as to ensure antireflection according to the principle of the antireflection film, thereby reducing the wavelength dependence of the reflectivity.

As mentioned above, the black mask in accordance with the embodiment of the present invention can improve the etching characteristics at the manufacturing process, and it has characteristics largely exceeding the reflective characteristics of black masks formed by the prior art, and can reduce the reflectivity throughout the visible wavelength range and the wavelength dependence.

Figure 2:
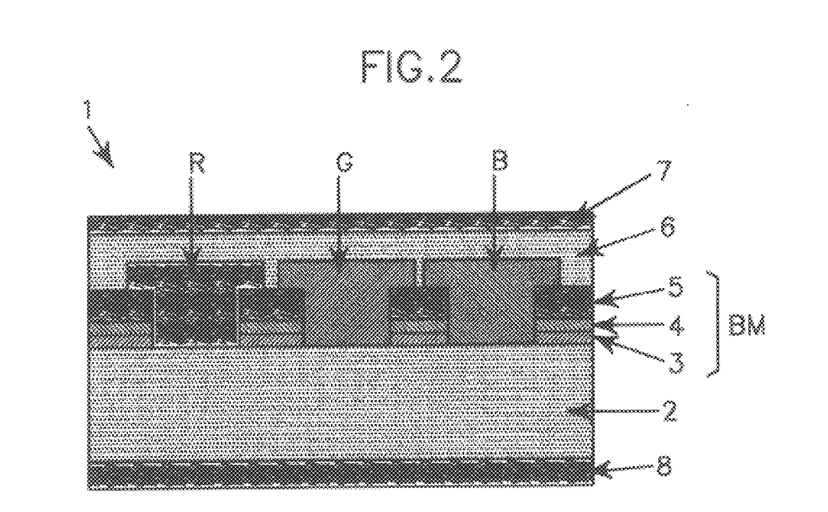
FIG. 2 is a sectional view taken along the arrow X—X of the color filter shown in FIG. 1.

FIG. 2 shows a sectional view taken along the arrow X—X of the color filter 1 illustrated in FIG. 1. The black mask BM has a plurality of apertures. Differently colored resins are disposed in their respective three neighboring apertures as optical filter. That is, a colored resin R is a resin colored in red, and the one obtained by allowing a photo resist to contain a coloring matter such as red pigment, followed by curing. A colored resin G is a resin colored in green, and the one obtained by allowing a photo resist to contain a coloring matter such as green pigment, followed by curing. A colored resin B is a resin colored in blue, and the one obtained by allowing a photo resist to contain a coloring matter such as blue pigment, followed by curing. With this color filter 1, the black mask BM separates the colored resins R, G, and B disposed in their respective apertures, and hence the light transmitted through the colored resins R, G, and B is separated. The reflectivity of the light applied to the black mask BM through the transparent substrate 2, and the wavelength dependence of the reflectivity are sufficiently reduced. Accordingly, the ratio of the reflected light to the light which has transmitted through the colored resins R, G, and B can be reduced. This can improve the visibility of the light which has transmitted through the colored resins R, G, and B.

Next, the manufacturing method of the color filter 1 in accordance with the above embodiment will now be described.

In order to manufacture the color filter 1 of the present invention, first, the glass substrate 2 which is transparent to visible light is prepared. Then, the first antireflection film 3, the second antireflection film 4, and the screening film 5 are successively formed on the surface of the transparent substrate 2.

The first antireflection film 3 is formed using a reactive sputtering method. That is, the transparent substrate 2 is placed in a chamber not shown, then metal or alloy is placed as target at a position opposite to the transparent substrate 2. Next, the pressure in the chamber is reduced to a first pressure $P_1$ or less, if required, followed by introduction of argon gas as inactive gas (rare gas) into the chamber. Further, a reactive gas (at least any one of oxygen gas, nitrogen gas, and carbon dioxide gas, or mixture thereof) to be reacted to a metal of target (Cr, Mo, W, Ni, or Ge) is introduced into the chamber, and the pressure in the chamber is held at a second pressure $P_2$. Then, the temperature of the transparent substrate 2 is held at a first temperature $T_1$ with measuring the temperature of the substrate 2, while a first sputtering power $W_1$ is applied to the target substrate to generate plasma. Thus, the metal of the target substrate is subjected to sputtering. Consequently, the reaction between the sputtered metal atom or molecule and the reactive gas introduced into the chamber results in the formation of the first antireflection film 3 on the transparent substrate 2.

Here, the first pressure $P_1$ is 1.5 Pa or less, and preferably 0.1 Pa or less. The second pressure $P_2$ is in the range of 0.1 Pa to 2.0 Pa, and preferably in the range of 0.1 Pa to 1.0 Pa. It is noted that the first temperature $T_1$ is in the range of room temperature (approximately 20° C.) to 500° C., preferably in the range of room temperature to 350° C., and most preferably in the range of room temperature to 150° C. The first sputtering power $W_1$ to be applied at the time of formation of the first antireflection film 3 is in the range of 0.5 W/cm$^2$ to 20 W/cm$^2$, and preferably in the range of 1 W/cm$^2$ to 10 W/cm$^2$. The sputtering rate and time at this process are not specifically limited. However, examples of the time required for obtaining the desired film thickness include the time in the range of 10 seconds to 1 hour, and preferably in the range of 30 seconds to 20 minutes.

The second antireflection film 4 is also formed using a reactive sputtering method. That is, the second antireflection film 4 is formed as follows: after the formation of the first antireflection film 3, without taking the substrate 2 out of the chamber, the gas in the chamber is evacuated until the pressure in the chamber becomes a third pressure $P_3$ or less, followed by introduction of argon gas as inactive gas (rare gas) into the chamber. Further, a reactive gas (at least any one of oxygen gas, nitrogen gas, and carbon dioxide gas, or mixture thereof) to be reacted to a metal of target (Cr, Mo, W, Ni, or Ge) is introduced into the chamber, and the pressure in the chamber is held at a fourth pressure $P_4$. Then, the temperature of the transparent substrate 2 is held at a second temperature $T_2$ with measuring the temperature of the substrate 2, while a second sputtering power $W_2$ is applied to the target substrate to generate plasma. Thus, the metal of the target substrate is subjected to sputtering. Consequently, the reaction between the sputtered metal atom or molecule and the reactive gas introduced into the chamber results in the formation of the second antireflection film 4 on the first antireflection film 3.

Here, the third pressure $P_3$ is 1.5 Pa or less, and preferably 0.1 Pa or less. The fourth pressure $P_4$ is in the range of 0.1 Pa to 2.0 Pa, and preferably in the range of 0.1 Pa to 1.0 Pa. It is noted that the second temperature $T_2$ is in the range of room temperature (approximately 20° C.) to 500° C., preferably in the range of room temperature to 350° C., and more preferably in the range of room temperature to 150° C. The second sputtering power $W_2$ to be applied at the time of formation of the second antireflection film 4 is in the range of 0.5 W/cm$^2$ to 20 W/cm$^2$, and preferably in the range of 1 W/cm$^2$ to 10 W/cm$^2$. The sputtering rate and time at this process are not specifically limited. However, examples of the time required for obtaining the desired film thickness include the time in the range of 10 seconds to 1 hour, and preferably in the range of 30 seconds to 20 minutes.

The screening film 5 is formed in the following manner. After the formation of the second antireflection film 4, the gas in the chamber is evacuated until the pressure in the chamber becomes a fifth pressure $P_5$ or less. Thereafter, argon gas is introduced into the chamber until the pressure in the chamber becomes a sixth pressure $P_6$. Then, the temperature of the substrate 2 is held at a third temperature $T_3$, while a third sputtering power $W_3$ is applied to the target substrate to generate plasma. Thus, the metal (Cr, Mo, W, Ni, or Ge) of the target substrate is subjected to sputtering. Then, the sputtered metal atom or molecule is deposited on the second antireflection film 4, resulting in the formation of the screening film 5.

Here, the fifth pressure $P_5$ is 1.5 Pa or less, and preferably 0.1 Pa or less. The sixth pressure $P_6$ is in the range of 0.1 Pa to 2.0 Pa, and preferably in the range of 0.1 Pa to 1.0 Pa. It is noted that the third temperature $T_3$ is in the range of room temperature (approximately 20° C.) to 500° C., preferably in the range of room temperature to 350° C., and more preferably in the range of room temperature to 150° C. The third sputtering power $W_3$ to be applied at the time of formation of the screening film 5 is in the range of 0.5 W/cm$^2$ to 20 W/cm$^2$, and preferably in the range of 1 W/cm$^2$ to 10 W/cm$^2$. The sputtering rate and time at this process are not specifically limited. However, examples of the time required for obtaining the desired film thickness include the time in the range of 10 seconds to 1 hour, and preferably in the range of 20 seconds to 30 minutes.

It is noted that the first antireflection film 3, the second antireflection film 4, and the screening film 5 may be formed using a CVD method, and a vacuum evaporation method other than the above-described sputtering method.

Next, positive photo resist is coated onto the surface of the screening film 5, followed by pre-baking. Thereafter, the photo resist is irradiated with light for transferring a pattern having a plurality of apertures thereon to be photosensitized. Subsequently, the photosensitized region of the photo resist is dissolved using a solvent to conduct development. Then, post-baking is carried out, thereby forming a photo resist layer having a plurality of apertures on the screening film 5. It is noted that some combinations of metallic compounds may entail peeling-off of the films, which can be improved by changing the film-forming conditions of each film, and coating conditions of positive photo resist.

Further, using the photo resist layer as mask, a etchant is allowed to be in contact with the screening film 5, the second antireflection film 4, and the first antireflection film 3, immediately under the apertures of the photo resist layer. Then, the contact area is etched. After the completion of etching, the photo resist layer is removed from the top of the screening film 5 using a solvent to form a black mask BM having a plurality of apertures. It is noted that, in the manufacturing of the black mask having the above-described structures, it is preferable to use an etchant mainly composed of ammonium cerium (IV) nitrate. In this case, it is possible to etch the screening film 5, the second antireflection film 4, and the first antireflection film 3, at the same time.

Next, a negative photo resist colored in red by containing red pigment is coated onto the black mask BM from a dispenser disposed above the substrate 2 to be charged in all the apertures of the black mask BM.

Thereafter, the substrate 2 coated by a red photo resist is subjected to pre-baking to form a red photo resist layer having a uniform thickness. It is noted that the substrate 2 may be caused to rotate about a rotation axis along its thickness so that the thickness of the red photo resist layer becomes uniform prior to pre-baking.

Next, exposure is performed so that red photo resist remains only on the regions corresponding to every three apertures along the row direction and column direction, and diagonally neighboring apertures of the apertures disposed in matrix of the black mask BM. Then, the red photo resist on the non-photosensitized region is removed using a solvent, followed by baking. This results in the formation of red resin R in prescribed apertures of the black mask BM.

Further, green-colored photoresist and blue-colored photo resist are used in place of the red photo resist to form a green resin G and a blue resin B, respectively, in prescribed apertures of the black mask BM using the same method as in the process of forming the red resin R. Each of the colored resins R, G, and B is disposed at such a position each corresponding to every three apertures along the row direction and the column direction and diagonally adjacent apertures of the black mask BM, Then, on the colored resins R, G, and B, the overcoat layer 6 is formed so that the surface becomes uniform. Further, the transparent electrode 7 is formed on the overcoat layer 6. Finally, the polarizing film 8 is formed to the back side of the transparent substrate 2, thus completing the color filter 1 shown in FIG. 1.

Next, a description will now be given to a liquid crystal display using the above-described color filter 1.

Figure 3:
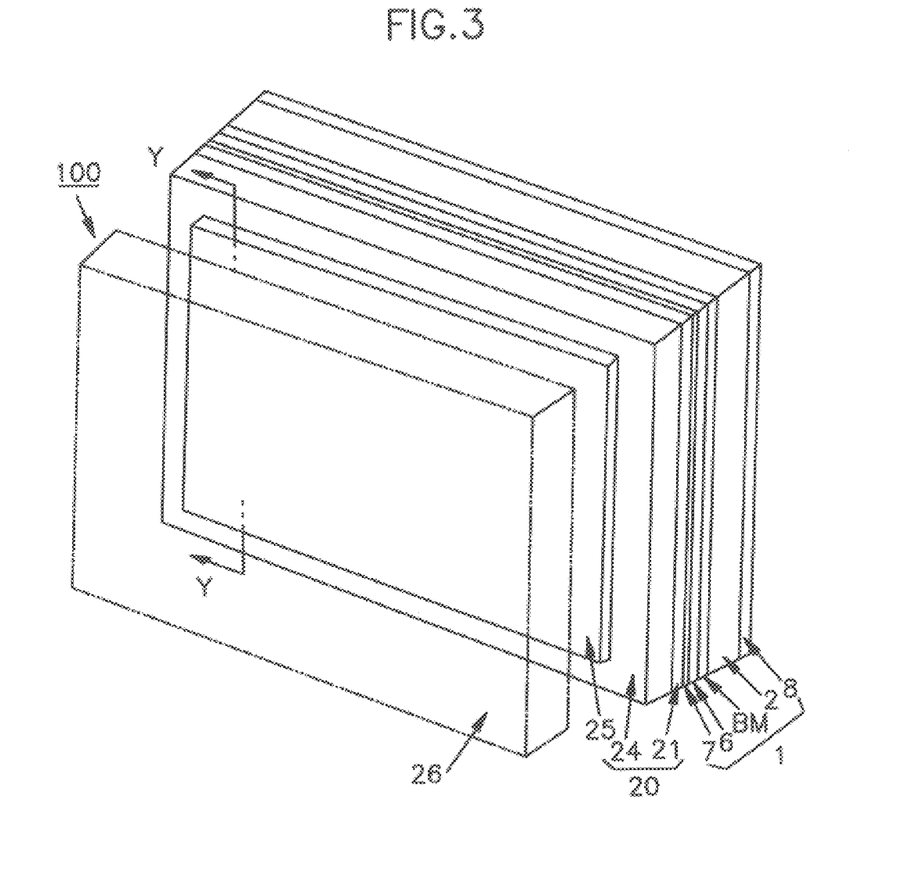
FIG. 3 is a perspective view of a liquid crystal display.
Figure 4:
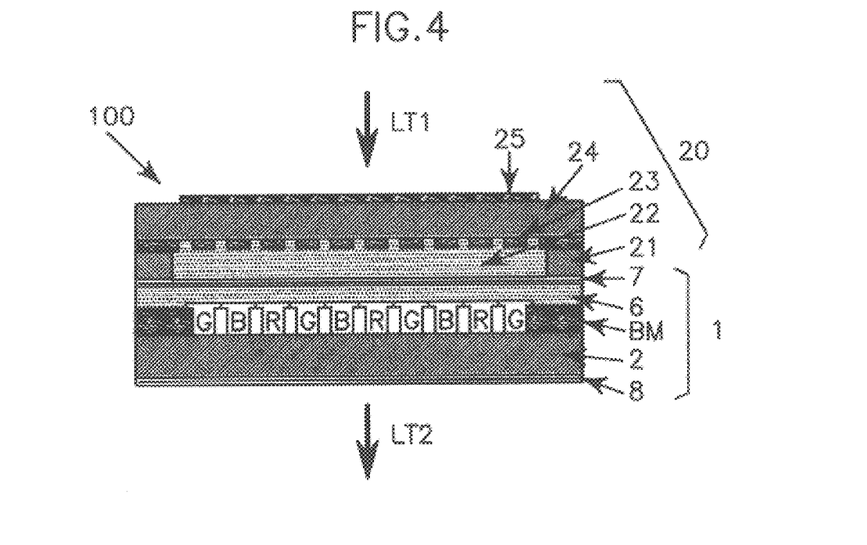
FIG. 4 is a sectional view taken along the arrow Y—Y of the liquid crystal display shown in FIG. 3.

FIG. 3 shows a perspective view illustrating the liquid crystal display 100. FIG. 4 shows a sectional view taken along the arrow Y—Y of the liquid crystal display 100 shown in FIG. 3. The liquid crystal display 100 of the present invention includes the color filter 1, a TFT (thin film transistor) substrate 20 joined onto the transparent electrode 7 of the color filter 1, and a backlight 26 fixed to a position interposing the TFT substrate 20 with the color filter 1.

The TFT substrate 20 includes: an outer frame 21 made of a light-proof resin surrounding the peripheral surface of the color filter 1; a liquid crystal layer 22 made of nematic liquid crystal charged within the outer frame 21; a plurality of pixel electrodes 23 each provided at every region, of the liquid crystal layer 22, corresponding to its respective aperture of the black mask BM; a transparent glass substrate 24 on which the pixel electrodes 23 are formed; and a polarizing film 25 formed on the exposed surface of the transparent glass substrate 24.

The polarizing films 8 and 25 have the polarization directions intersecting at right angles, and they are composed of organic materials such as polyimide. A plurality of the pixel electrodes 23 are connected to a plurality of thin film transistors formed on the glass substrate 24 of the TFT substrate, respectively. If a specific pixel electrode 23 is applied with a prescribed potential, a prescribed voltage is applied between the specific pixel electrode 23 and transparent electrode 7. Thus, an electric field formed in accordance with the voltage changes the orientation of the region corresponding to the specific pixel electrode 23 of the liquid crystal layer 22.

The polarized component in a specific direction of white light LT1 emitted from the backlight 26 passes through the polarizing film 25 to enter the liquid crystal layer 22. The incident light is split by every pixel electrode 23, and the polarization direction changes in accordance with the amount of orientation of the liquid crystal layer 22. The rays of light split by every pixel electrode 23 enter the colored resins R, G, and B of the color filter 1, respectively, and transmit therethrough. On the emitting-side of the color filter 1, is provided the polarizing film 8. Accordingly, the amount of light transmitted through the polarizing film 8 varies depending upon the amount of orientation of the liquid crystal layer 22. The amount of orientation of the liquid crystal layer 22 is proportional to the potential given to the pixel electrode 23. Therefore, control of the potential given to the pixel electrode 23 can control the light amount of the emitted light LT2.

As described above, the color filter 1 in accordance with the above embodiment includes: the black mask BM; the transparent substrate 2 on which the black mask BM is formed; and colored resins R, G, and B disposed in a plurality of apertures of the black mask BM. The black mask BM separates the colored resins R, G, and B each disposed in their respective apertures of the black mask BM, and hence this color filter 1 separates the light transmitting through the colored resins R, G, and B. The reflectivity, and the wavelength dependence of the reflectivity are small. Accordingly, the ratio of the reflected light to the light LT2 transmitted through the colored resins R, G, and B can be reduced, thereby improving the visibility of the light transmitted through the colored resins R, G, and B.

Also, the liquid crystal display 100 in accordance with the above embodiment includes: the color filter 1, the liquid crystal layer 22 provided at a position opposite to the color filter 1; and a plurality of pixel electrodes 23 each provided at a position capable of independently changing the orientation of different regions, of the liquid crystal layer 22, opposite to a plurality of the apertures of the black mask BM by application of a prescribed potential. In this liquid crystal display 100, the orientation of different regions, of the liquid crystal layer 22, opposite to a plurality of the apertures of the black mask BM can be changed independently by applying a prescribed potential to the pixel electrodes 23. Accordingly, the light amount of the light LT1 inputted to the liquid crystal layer 22 can be controlled independently at different apertures of the black mask BM. The colored resins R, G, and B are disposed each in its respective aperture of the black mask BM. Therefore, the light of wavelength component corresponding to their respective colored resins R, G, and B can be emitted independently from every region above mentioned. The color filter 1 of the liquid crystal display 100 can improve the visibility of the light transmitted through the colored resins R, G, and B, which enables the display of clear pictures on the liquid crystal display 100.

EXAMPLES

Black masks BM in accordance with the above embodiments and the comparative example thereof were produced, and the reflectivity and the wavelength dependence of the reflectivity thereof were measured.

Example 1

Of the black masks BM of the above embodiments, the one in which the first antireflection film 3/second antireflection film 4/screening film 5 has a structure of (1) $CrO_XN_YC_Z$/$WO_AN_BCc$/Cr was produced using the following method. First, a glass substrate 2 was fitted in the chamber of a sputtering device. Then, the chamber was evacuated to $1.0×10^{-4}$ Pa. Thereafter, mixed gas of nitrogen gas and carbon dioxide gas was introduced into the chamber until the pressure in the chamber becomes 0.4 Pa. The ratio of flow rate on a percentage basis of nitrogen gas and carbon dioxide gas, $N_2:CO_2$, was 1:1. Further, the sputtering power was set at 10 W/cm$^2$ to conduct reactive sputtering using chromium metal as target. Consequently, a first antireflection film 3 with a film thickness of 55 nm containing a chromium oxide, chromium nitride, chromium carbide, chromium oxide nitride, chromium oxide carbide, chromium nitride carbide, and/or chromium oxide nitride was formed on the substrate 2.

Next, the atmosphere in the chamber was evacuated until the pressure in the chamber becomes $1.0×10^{-4}$ Pa. Thereafter, mixed gas of argon gas, nitrogen gas, and carbon dioxide gas was introduced into the chamber until the pressure in the chamber becomes 0.4 Pa. The ratio of flow rate on a percentage basis of argon gas, nitrogen gas, and carbon dioxide gas, $Ar:N_2:CO_2$, was 10:5:4. Further, the sputtering power was set at 4 W/cm$^2$ to conduct reactive sputtering using tungsten metal as target. Consequently, a second antireflection film 4 with a film thickness of 38 nm containing a tungsten oxide, tungsten nitride, tungsten carbide, tungsten oxide nitride, tungsten oxide carbide, tungsten nitride carbide, and/or tungsten oxide nitride was formed on the first antireflection film 3.

Next, the atmosphere in the chamber was evacuated until the pressure in the chamber becomes $1.0×10^{-4}$ Pa. Thereafter, argon gas was introduced into the chamber until the pressure in the chamber becomes 0.1 Pa. Further, the sputtering power was set at 5 W/cm$^2$ to conduct sputtering using chromium metal as target. Consequently, a screening film 5 with a film thickness of 100 nm made of chromium metal was formed on the second antireflection film 4. All of the temperatures of the substrate 2 at the steps of forming the above-described films 3 to 5 were room temperature. Finally, the above-described films 3 to 5 were wet-etched as described above to produce a black mask BM. In this etching process, cerium nitrate (IV) ammonium was used as etchant.

All of the etching rates of the first antireflection film 3, the second antireflection film 4, and the screening film 5 were 1 or less, assuming the etching rate of the chromium metal to be 1, and fine and good edge shape was obtained.

Example 2

Of the black masks BM of the above embodiment, the one in which the first antireflection film 3/second antireflection film 4/screening film 5 has a structure of (2) $CrO_XN_Y$/$MoO_AN_B$/Cr was produced using the following method. First, the glass substrate 2 was fitted in the chamber of a sputtering device. Then, the chamber was evacuated to $1.0\times10^{-4}$ Pa. Thereafter, mixed gas of nitrogen gas and oxygen gas was introduced into the chamber until the pressure in the chamber becomes 0.4 Pa. The ratio of flow rate on a percentage basis of nitrogen gas and oxygen gas, $N_2$:$O_2$, was 1:1. Further, the sputtering power was set at 10 W/cm² to conduct reactive sputtering using chromium metal as target. Consequently, a first antireflection film 3 with a film thickness of 55 nm containing a chromium oxide, chromium nitride, and/or chromium oxide nitride was formed on the substrate 2.

Next, the atmosphere in the chamber was evacuated until the pressure in the chamber becomes $1.0\times10^{-4}$ Pa. Thereafter, mixed gas of argon gas, nitrogen gas, and oxygen gas was introduced into the chamber until the pressure in the chamber becomes 0.4 Pa. The ratio of flow rate on a percentage basis of argon gas, nitrogen gas, and oxygen gas, Ar:$N_2$:$O_2$, was 10:5:3. Further, the sputtering power was set at 4 W/cm² to conduct reactive sputtering using molybdenum metal as target. Consequently, a second antireflection film 4 with a film thickness of 41 nm containing a molybdenum oxide, molybdenum nitride, and/or molybdenum oxide nitride was formed on the first antireflection film 3.

Next, the atmosphere in the chamber was evacuated until the pressure in the chamber becomes $1.0\times10^{-4}$ Pa. Thereafter, argon gas was introduced into the chamber until the pressure in the chamber becomes 0.1 Pa. Further, the sputtering power is set at 5 W/cm² to conduct sputtering using chromium metal as target. Consequently, a screening film 5 with a film thickness of 100 nm made of chromium metal was formed on the second antireflection film 4. All of the temperatures of the substrate 2 at the steps of forming the above-described films 3 to 5 were room temperature. Finally, the above-described films 3 to 5 were wet-etched as described above to produce a black mask BM. In this etching process, cerium nitrate (IV) ammonium was used as etchant.

All of the etching rates of the first antireflection film 3, the second antireflection film 4, and the screening film 5 were 1 or less, assuming the etching rate of the chromium metal to be 1, and fine and good edge shape was obtained.

Example 3

Of the black masks BM of the above embodiments, the one in which the first antireflection film 3/second antireflection film 4/screening film 5 has a structure of $WO_XN_YC_Z$/$WO_AN_B$Cc/Cr was produced using the following method. First, a glass substrate 2 was fitted in the chamber of a sputtering device. Then, the chamber was evacuated to $1.0\times10^{-4}$ Pa. Thereafter, mixed gas of nitrogen gas and carbon dioxide gas was introduced into the chamber until the pressure in the chamber becomes 0.4 Pa. The ratio of flow rate on a percentage basis of nitrogen gas and carbon dioxide gas, $N_2$:$CO_2$ was 1:2. Further, the sputtering power was set at 8 W/cm² to conduct reactive sputtering using tungsten metal as target. Consequently, a first antireflection film 3 with a film thickness of 55 nm containing a tungsten oxide, tungsten nitride, tungsten carbide, tungsten oxide nitride, tungsten oxide carbide, tungsten nitride carbide, and/or tungsten oxide nitride was formed on the substrate 2.

Next, the atmosphere in the chamber was evacuated until the pressure in the chamber becomes $1.0\times10^{-4}$ Pa. Thereafter, mixed gas of argon gas, nitrogen gas, and carbon dioxide gas was introduced into the chamber until the pressure in the chamber becomes 0.4 Pa. The ratio of flow rate on a percentage basis of argon gas, nitrogen gas, and carbon dioxide gas, Ar:$N_2$:$CO_2$, was 10:5:4. Further, the sputtering power was set at 4 W/cm² to conduct reactive sputtering using tungsten metal as target. Consequently, a second antireflection film 4 with a film thickness of 38 nm containing a tungsten oxide, tungsten nitride, tungsten carbide, tungsten oxide nitride, tungsten oxide carbide, tungsten nitride carbide, and/or tungsten oxide nitride was formed on the first antireflection film 3.

Next, the atmosphere in the chamber was evacuated until the pressure in the chamber becomes $1.0\times10^{-4}$ Pa. Thereafter, argon gas was introduced into the chamber until the pressure in the chamber becomes 0.1 Pa. Further, the sputtering power was set at 5 W/cm² to conduct sputtering using chromium metal as target. Consequently, a screening film 5 with a film thickness of 100 nm made of chromium metal was formed on the second antireflection film 4. All of the temperatures of the substrate 2 at the steps of forming the above-described films 3 to 5 were room temperature. Finally, the above-described films 3 to 5 were wet-etched as described above to produce a black mask BM. In this etching process, cerium nitrate (IV) ammonium was used as etchant.

All of the etching rates of the first antireflection film 3, the second antireflection film 4, and the screening film 5 were 1 or less, assuming the etching rate of the chromium metal to be 1, and fine and good edge shape was obtained.

Comparative Example

A black mask BM in accordance with the comparative example is produced by the following method. First, a glass substrate 2 is fitted in the chamber of a sputtering device. Then, the chamber is evacuated to $1.0\times10^{-4}$ Pa. Thereafter, mixed gas of argon gas, nitrogen gas, and carbon dioxide gas is introduced into the chamber until the pressure in the chamber becomes 0.4 Pa. The ratio of flow rate on a percentage basis of argon gas, nitrogen gas, and carbon dioxide gas, Ar:$N_2$:$CO_2$ was 2:1:1. Further, the sputtering power was set at 2 W/cm² to conduct reactive sputtering using chromium metal as target. Consequently, a first antireflection film 3 with a film thickness of 60 nm containing a chromium oxide, chromium nitride, chromium carbide, chromium oxide nitride, chromium oxide carbide, chromium nitride carbide, or chromium oxide nitride carbide was directly formed on the substrate 2.

Next, the atmosphere in the chamber is evacuated until the pressure in the chamber becomes $1.0\times10^{-4}$ Pa. Thereafter, mixed gas of argon gas, nitrogen gas, and carbon dioxide gas was introduced into the chamber until the pressure in the chamber became 0.4 Pa. It is noted that the ratio of flow rate on a percentage basis of argon gas, nitrogen gas, and carbon dioxide gas, Ar:$N_2$:$CO_2$ was 10:5:1. Further, the sputtering power was set at 2 W/cm² to conduct reactive sputtering using chromium metal as target. Consequently, a second antireflection film 4 with a film thickness of 40 nm containing a chromium oxide, chromium nitride, chromium carbide, chromium oxide nitride, chromium oxide carbide, chromium nitride carbide, or chromium oxide nitride carbide was formed on the first antireflection film 3.

Next, the atmosphere in the chamber was evacuated until the pressure in the chamber became $1.0 \times 10^{-4}$ Pa. Thereafter, argon gas is introduced into the chamber until the pressure in the chamber becomes 0.1 Pa. Further, the sputtering power was set at 5 W/cm$^2$ to conduct sputtering using chromium metal as target. Consequently, a screening film 5 with a film thickness of 100 nm made of chromium metal was formed on the second antireflection film 4. All of the temperatures of the substrate 2 at the steps of forming the above-described films 3 to 5 were room temperature. Finally, the above-described films 3 to 5 were wet-etched as described above to produce a black mask BM. In this etching process, cerium nitrate (IV) ammonium was used as etchant.

In the black mask BM in accordance with the above comparative example, the etching rates of the first antireflection film 3, the second antireflection film 4, and the screening film 5 were 0.5 or less, 5 or more, and 1, respectively, assuming the etching rate of the chromium metal to be 1. Accordingly, the black mask pattern formed using an etchant for a chromium film, there occurred a lack of the pattern.

Measuring Method and Results

Transparent substrates 2 on which the black masks BM in accordance with the examples 1 to 3, and comparative example were formed, respectively, were prepared, to which incident light was applied from the transparent substrate 2 side to measure the reflectivity of the light from each black mask BM. Each of the reflectivity was measured from the glass substrate 2 side by means of a MINOLTA CM-2002 spectrophotometer.

Figure 5:
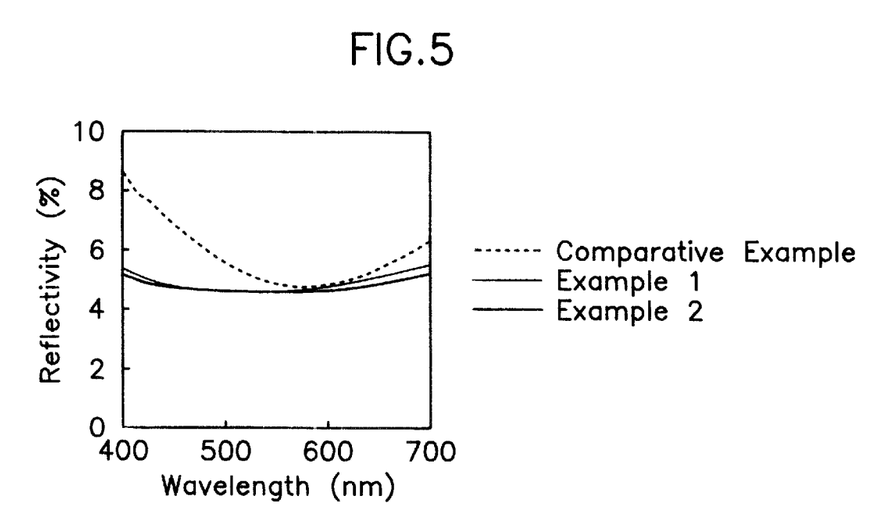
FIG. 5 is a graph showing the relationship between the wavelength (nm) and the reflectivity (%) of incident light in Examples 1 and 2.
Figure 6:
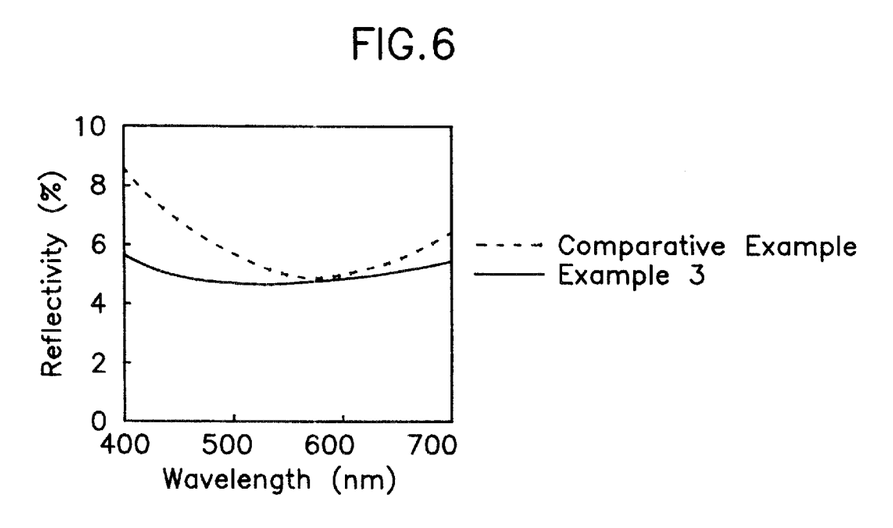
FIG. 6 is a graph showing the relationship between the wavelength (nm) and the reflectivity (%) of incident light in Example 3.

FIG. 5 is a graph showing the relationship between the wavelength (nm) and reflectivity (%) of the incident light measured in this manner. When the black mask BM in accordance with the above example 1 is formed on the transparent substrate 2, the wavelength dependence of the reflectivity is smaller than the wavelength dependence of the reflectivity of the comparative example over a visible wavelength range of of 400 to 700 nm. When the black mask BM in accordance with the above example 2 is formed on the transparent substrate 2, the wavelength dependence of the reflectivity is reduced than the wavelength dependence of the reflectivity of the example 1 over a visible wavelength range of 400 to 700 nm. Also, in the examples 1 to 3, there occur no lacks in the pattern, and good edge shape can be obtained as compared with the black mask pattern of the comparative example.

Further, with the black mask BM in accordance with the above examples, a red resist is coated thereon, after which exposure and development are performed to form a red pixel, followed by manufacturing blue and green pixels. Further, an ITO electrode is formed in film thereon, followed by carrying out a series of operations such as manufacturing of an alignment layer, rubbing, spraying of spacer, bonding of opposing electrode substrate having the alignment layer which has been subjected to rubbing on its surface, filling of liquid crystals, sealing, and bonding of a polarizing film, thus manufacturing a liquid crystal display. The liquid crystal display thus manufactured is lower-reflective, and is more excellent in display performances such as contrast than in the case of conventional liquid crystal displays.

The present invention can provide a black mask having reflective characteristics largely exceeding the reflective characteristics of conventional black masks, having small wavelength dependence of the reflectivity overall the visible wavelength range, and being good in its etching characteristics, and a color filter and a liquid crystal display which can provide clear pictures.

What is claimed is:

1. A black mask which comprises: a first and a second antireflection films each comprising oxide, nitride, carbide, oxide nitride, oxide carbide, nitride carbide, or oxide nitride carbide of at least one kind of metal selected from the group consisting of chromium, molybdenum, tungsten, nickel, and germanium, and said films each having a different composition; and a screening film comprising at least one kind of metal selected from the group consisting of chromium, molybdenum, tungsten, nickel, and germanium; wherein said three films are successively formed on a transparent substrate, and at least one but not all of said three films contains chromium.

2. A black mask according to claim 1, wherein the first and the second antireflection films each comprise oxide, nitride, carbide, oxide nitride, oxide carbide, nitride carbide, or oxide nitride carbide of the same kind of metal.

3. A black mask according to claim 1, wherein the first and the second antireflection films each comprise oxide, nitride, carbide, oxide nitride, oxide carbide, nitride carbide, or oxide nitride carbide of different kind of metal.

4. A black mask according to claim 1, wherein both of the first and second antireflection film comprises tungsten compounds, and the screening film comprises chromium.

5. A black mask according to claim 1, wherein the first antireflection film comprises a chromium compound, the second antireflection film comprises a molybdenum compound or a tungsten compound, and the screening film comprises chromium.

6. A color filter which comprises: the black mask described in claim 1, and colored resins disposed within a plurality of apertures of the black mask.

7. A liquid crystal display which comprises: a first substrate comprising the color filter described in claim 6; a second substrate comprising a plurality of electrodes; a liquid crystal layer being interposed between the first and second substrates, and being capable of independently changing its orientation at different regions opposite to a plurality of the apertures of the black mask by applying a potential to said electrodes.

* * * * *